(12) United States Patent
Sakamoto

(10) Patent No.: US 11,567,820 B2
(45) Date of Patent: Jan. 31, 2023

(54) INTERNAL SIGNAL MONITORING CIRCUIT

(71) Applicant: MICRON TECHNOLOGY, INC., Boise, ID (US)

(72) Inventor: Yusuke Sakamoto, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 240 days.

(21) Appl. No.: 16/992,007

(22) Filed: Aug. 12, 2020

(65) Prior Publication Data
US 2022/0050737 A1   Feb. 17, 2022

(51) Int. Cl.
| | |
|---|---|
| G11C 7/22 | (2006.01) |
| G06F 11/07 | (2006.01) |
| G06F 11/30 | (2006.01) |
| G11C 7/10 | (2006.01) |
| G11C 11/4076 | (2006.01) |
| G11C 29/08 | (2006.01) |

(52) U.S. Cl.
CPC ........ *G06F 11/0772* (2013.01); *G06F 11/076* (2013.01); *G06F 11/0757* (2013.01); *G06F 11/3075* (2013.01); *G11C 7/1045* (2013.01); *G11C 7/222* (2013.01); *G11C 11/4076* (2013.01); *G11C 29/08* (2013.01)

(58) Field of Classification Search
CPC ................................. G11C 7/1045; G11C 7/22
USPC ......................................................... 365/201
See application file for complete search history.

(56) References Cited

U.S. PATENT DOCUMENTS

| | | | |
|---|---|---|---|
| 2006/0274875 A1* | 12/2006 | Vereen ................. | H04L 7/0334 375/371 |
| 2007/0116169 A1* | 5/2007 | Robbe .................... | H03L 7/085 375/376 |
| 2009/0092000 A1* | 4/2009 | Hara ....................... | G11C 8/10 365/230.06 |

\* cited by examiner

*Primary Examiner* — Muna A Techane
(74) *Attorney, Agent, or Firm* — Dorsey & Whitney LLP

(57) ABSTRACT

Disclosed herein is an apparatus that includes a first circuit configured to measure a first time period from a first active edge of one of plurality of internal signals to a second active edge of one of the plurality of internal signals, and a second circuit configured to compare the first time period with a second time period to generate an alert signal.

16 Claims, 9 Drawing Sheets

INTERNAL SIGNAL MONITORING CIRCUIT

BACKGROUND

There is a case Where a semiconductor device such as a DRAM includes an evaluation circuit referred to as "process monitor". Evaluation data generated by the process monitor is output to a tester in a manufacturing stage of the semiconductor device, and judgment is made based on the evaluation data whether an internal circuit is operated at designed timings. However, even in a case where the internal circuit is operated at designed timings in the manufacturing stage, operation timings may be deviated because of age deterioration of elements forming the internal circuit. When the age deterioration progresses, in some cases, an operation error suddenly occurs years after shipping.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structural, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
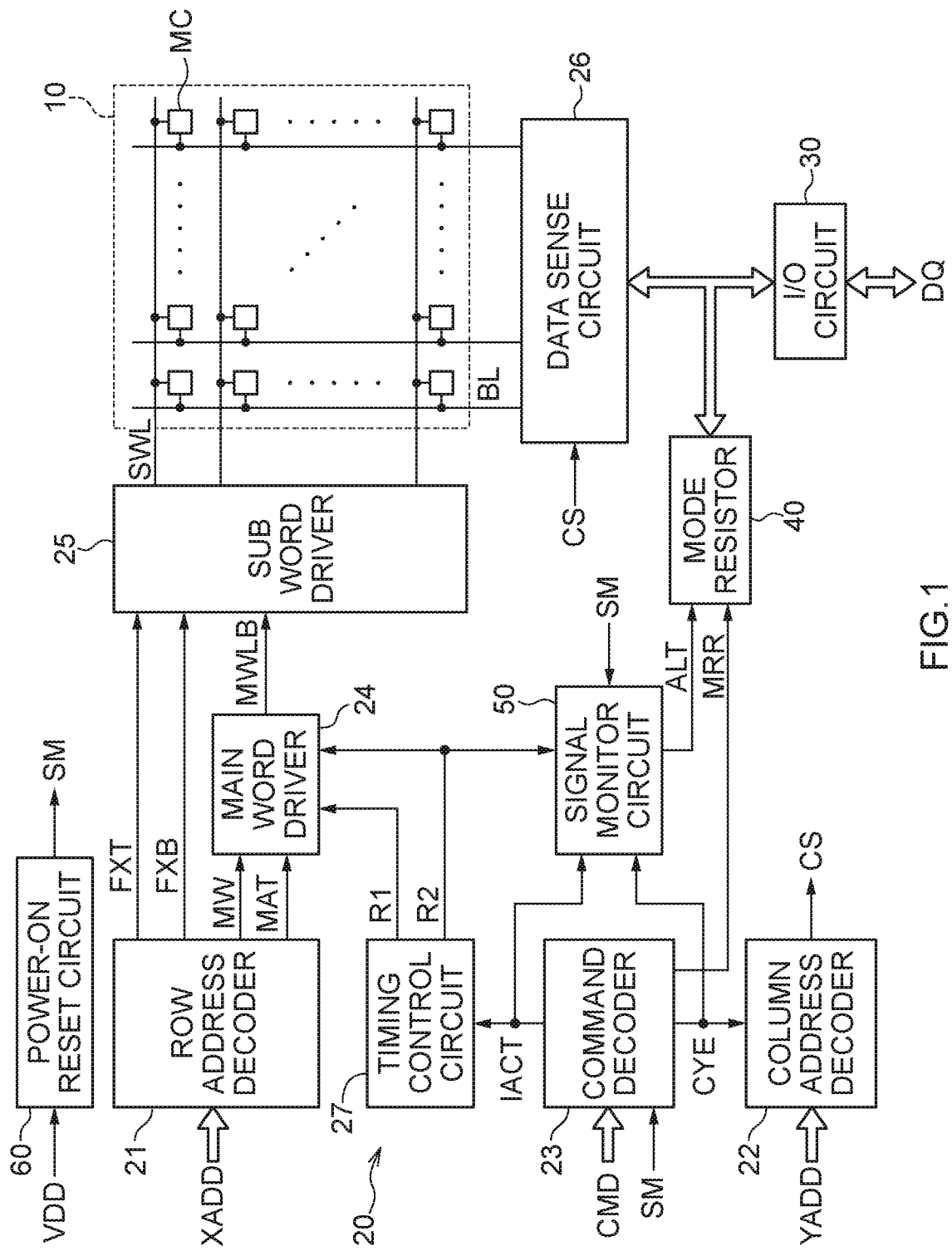
FIG. 1 is a block diagram showing a configuration of a semiconductor device according to an embodiment of the present disclosure.

A semiconductor device shown in FIG. 1 includes a memory cell array 10, an access control circuit 20 that makes access to the memory cell array 10, and an I/O circuit 30 that performs input and output of data. The memory cell array 10 includes a plurality of sub word lines SWL, a plurality of bit lines BL, and a plurality of memory cells MC arranged at respective intersections between the sub word lines SWL and the bit lines BL. The memory cells MC are, for example, DRAM cells. The access control circuit 20 includes a row address decoder 21 that decodes a row address XADD, a column address decoder 22 that decodes a column address YADD, and a command decoder 23 that decodes a command CMD.

The row address decoder 21 predecodes the row address XADD supplied from outside, thereby generating a mat selection signal MAT, a main-word-line selection signal MW, and sub-word-line selection signals FXT and FXB. The access control circuit 20 further includes a main word driver 24 and a sub word driver 25. The mat selection signal MAT and the main-word-line selection signal MW are supplied to the main word driver 24. The main word driver 24 drives a main word signal MWLB based on the mat selection signal MAT and the main-word-line selection signal MW. The sub word driver 25 drives the sub word lines SWL based on the main word signal MWLB and the sub-word-line selection signals FXT and FXB.

The column address decoder 22 decodes the column address YADD supplied from outside so as to generate a column selection signal CS. The column selection signal CS is supplied to a data sense circuit 26 included in the access control circuit 20. The data sense circuit 26 is connected to the bit lines BL, and any of the bit lines BL which is indicated by the column selection signal CS is connected to the I/O circuit 30.

The command decoder 23 decodes the command CMD issued from outside so as to generate various internal control signals. For example, the command decoder 23 activates an active signal IACT in a case where the command CMD indicates an active command, activates a column enable signal CYE in a case where the command CMD indicates a read command or a write command, and activates a mode register read signal MRR in a case where the command CMU indicates a mode register read command. The active signal IACT is supplied to a timing control circuit 27 included in the access control circuit 20. The timing control circuit 27 activates timing signals R1 and R2 in this order when the active signal IACT is activated. The timing signals R1 and R2 are supplied to the main word driver 24. The column enable signal CYE is supplied to the column address decoder 22. The column address decoder 22 activates the column selection signal CS in response to the column enable signal CYE. The activate signal TACT and the timing signals R1 and R2 may be considered as row-system signals, which are related to accessing a main or sub word line. The column enable signal CYE may be considered as a column-system signal, which is related to accessing hit lines BL. The mode register read signal MRR is supplied to a mode register 40. The mode register 40 is a circuit that stores various operation parameters therein. When the mode register read signal MRR is activated, the parameters stored in the mode register 40 are output to outside via the I/O circuit 30. The parameters stored in the mode register 40 can be overwritten from outside via the I/O circuit 30.

The semiconductor device according to the present embodiment further includes a signal monitor circuit 50. The signal monitor circuit 50 is a circuit for evaluating activation timings of various internal signals of the semiconductor device. In the example shown in FIG. 1, the active signal IACT, the timing signal R2, and the column enable signal CYE are input to the signal monitor circuit 50. The signal monitor circuit 50 may evaluate the activation timings of various internal signals in parallel to an operation of the access control circuit 20 in a normal operation, or may evaluate the activation timings of various internal signals in a period of an initializing operation performed after power on. In the latter case, it suffices to activate the signal monitor circuit 50 at a timing at which a power-on reset circuit 60 that monitors the level of a power-supply potential VDD generates a monitoring start signal SM. The power-on reset circuit 60 activates the monitoring start signal SM, for example, at a timing at which the level of the power-supply potential VDD has reached a sufficient level for making access to the memory cell array 10.

Figure 2:
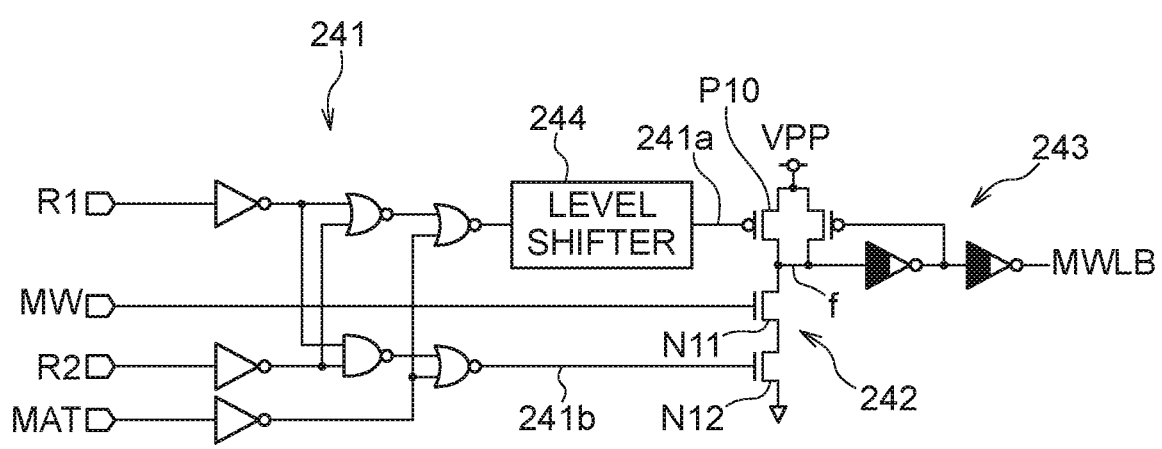
FIG. 2 is a circuit diagram of a main word driver.

As shown in FIG. 2, the main word driver 24 includes a logic circuit 241 that receives the timing signals R1 and R2 and the mat selection signal MAT, a selection circuit 242 that is pre-charged by an output signal 241a of the logic circuit 241 and is discharged by an output signal 241b of the logic circuit 241 and the main-word-line selection signal MW, and an output circuit 243 that latches an output of the selection circuit 242 and outputs the main word signal MWLB. A level shifter circuit 244 is inserted between the logic circuit 241 and the selection circuit 242.

The logic circuit 241 sets the output signal 241a at a low level when the mat selection signal MAT is activated to a high level in a period in which both the timing signals R1 and R2 are at a high level, thereby turning on a P-channel MOS transistor P10 included in the selection circuit 242. A boosted potential VPP is supplied to a source of the transistor VPP, and thus when the transistor P10 is turned on, an internal node f is pre-charged to the boosted potential VPP. Thereafter, when at least one of the timing signals R1 and R2 is changed to a low level, the transistor P10 is set in an off-state. In this state, when the main-word-line selection signal MW becomes a high level and both the timing signals R1 and R2 are changed to be a low level, N-channel MOS transistors N11 and N12 both included in the selection circuit 42 are turned on. Therefore, the internal node f is discharged to a level VSS. As a result, the main word signal MWLB output from the output circuit 243 is activated to a potential VSS. On the other hand, when the main-word-line selection signal MW remains at a low level, the internal node f is maintained at a level VPP, and thus the main word signal MWLB remains in a deactivated state at the boosted potential VPP.

Figure 3:
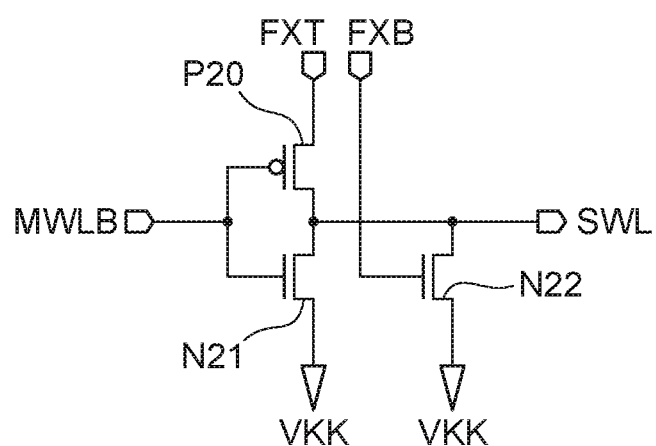
FIG. 3 is a circuit diagram of a sub word driver.

As shown in FIG. 3, the sub word driver 25 is configured by a P-channel MOS transistor P20 and N-channel MOS transistors N21 and N22, where drains thereof are connected to the sub word line SWL. The sub-word-line selection signal FXT is supplied to a source of the transistor P20, and a potential VKK is supplied to sources of the transistors N21 and N22. Further, the main word signal MWLB is supplied to gates of the transistors P20 and N21, and the sub-word-line selection signal FXB is supplied to a gate of the transistor N22. The sub-word-line selection signals FXT and FXB are signals having an amplitude of VSS to VPP and make transition in synchronization with the timing signal R1.

With this configuration, when the main word signal MWLB is activated to a low level (a level VSS) while the sub-word-line selection signals FXT and FXB are at a level VPP and the level VSS, respectively, the sub word line SWL is driven to the level VPP via the transistor P20. Accordingly, read data is read out from a memory cell MC connected to that sub word line SWL via a corresponding bit line BL. On the other hand, in a case where the main word signal MWLB is deactivated at a high level (the level VPP) even while the sub-word-line selection signals FXB and FXB are at the level VPP and the level VSS, respectively, the sub word line SWL is deactivated to a level VKK by the transistor N21.

Figure 4:
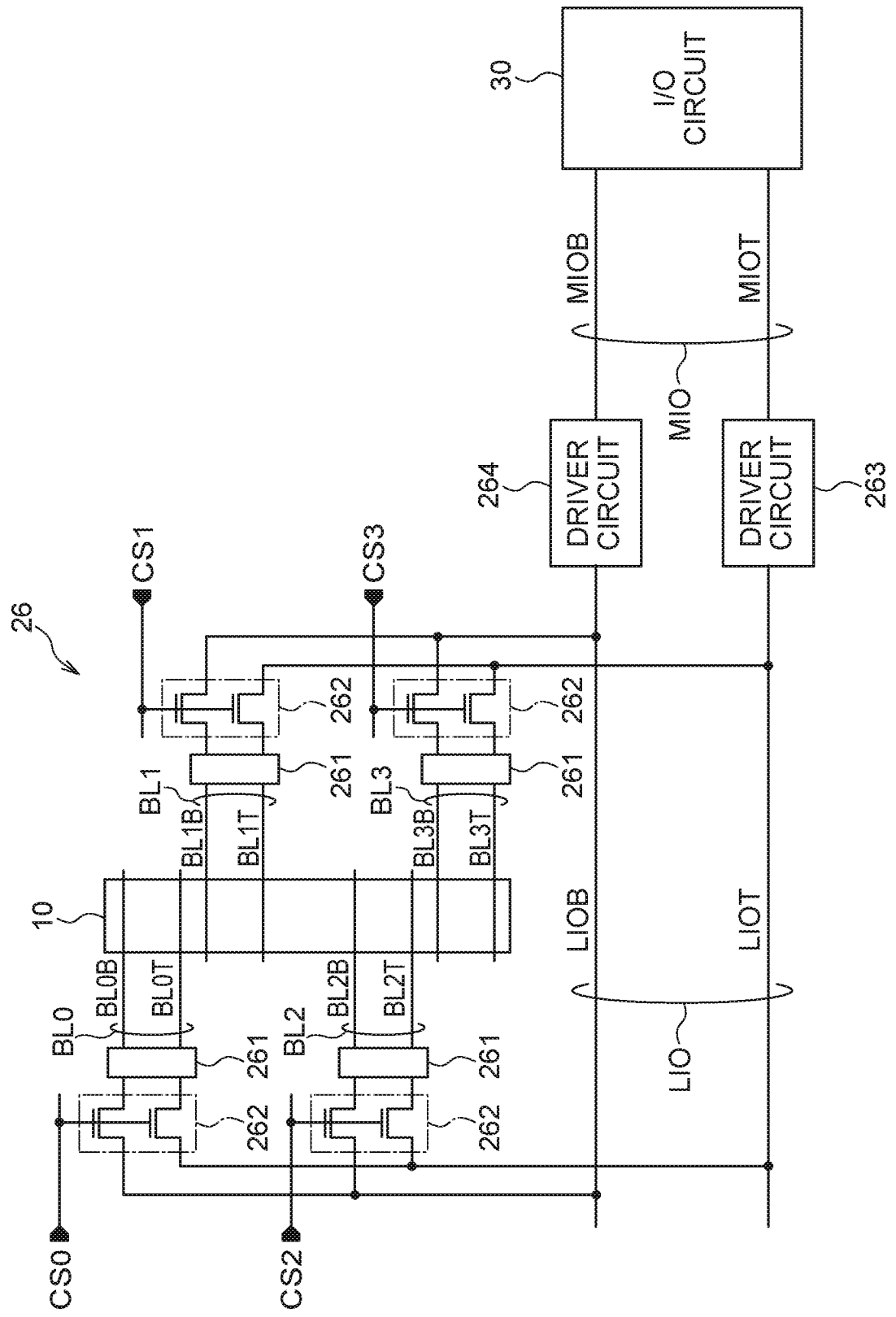
FIG. 4 is a circuit diagram of a data sense circuit.

As shown in FIG. 4, the data sense circuit 26 includes sense amplifiers 261 connected to bit line pairs BL0, BL1, BL2, and BL3, . . . and column switches 262 assigned to the sense amplifiers 261. The bit line pair BL0 includes complimentary bit lines BL0T and BL0B, the bit line pair BL1 includes complimentary bit lines BL1T and BL1B, the bit line pair BL2 includes complimentary bit lines BL2T and BL2B, and the bit line pair BL3 includes complimentary bit lines BL3T and BL3B. The bit line pairs BL0, BL1, BL2, and BL3, . . . are respectively connected to a local I/O line pair LIO via a corresponding one of the sense amplifiers 261 and a corresponding one of the column switches 262. The column selection signals CS corresponding thereto are supplied respectively to the column switches 262. More specifically, column selection signals CS0, CS1, CS2, and CS3 are supplied to the column switches 262 corresponding to the bit line pairs BL0, BL1, BL2, and BL3, respectively. The column selection signals CS assigned to the same local I/O line pair are exclusively activated.

The local I/O line pair LIO is connected to the I/O circuit 30 via a main I/O line pair MIO. The main I/O line pair MIO includes complementary main I/O lines MIOT and MIOB. In a read operation, read data read out from the memory cell array 10 is transferred to the I/O circuit 30 via the local I/O line pair LIO and the main I/O line pair MIO. In a write operation, write data supplied from outside is transferred to the local I/O line pair LIP via the I/O circuit 30 and the main I/O line pair MIO. A driver circuit 263 is provided between the main I/O line MIOT and the local I/O line LIOT, and a driver circuit 264 is provided between the main I/O line MIOB and the local I/O line LIOB. The driver circuits 263 and 264 have a function of driving the local I/O line pair LIO in a write operation.

Figure 5:
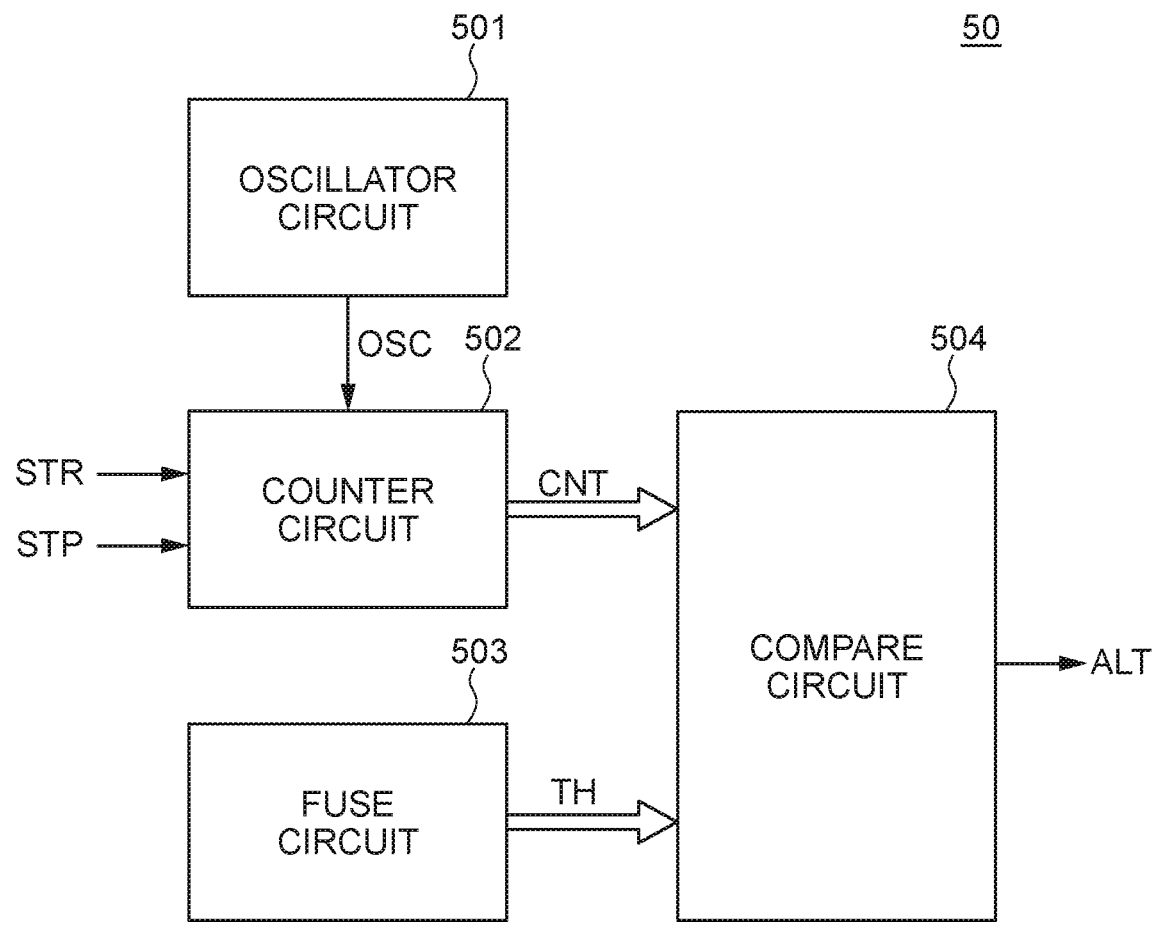
FIG. 5 is a circuit diagram of a signal monitor circuit according to an embodiment of the disclosure.

As shown in FIG. 5, the signal monitor circuit 50 includes an oscillator circuit 501 that generates an oscillation signal OSC, a counter circuit 502 that performs a counting operation in synchronization with the oscillation signal OSC, a fuse circuit 503 that holds a threshold value TH in a nonvolatile manner, and a comparator circuit 504 that compares a count value CNT of the counter circuit 502 and the threshold value TH with each other. The threshold value TH is a binary data that indicates an upper limit value or a lower limit value of the count value CNT. The threshold value TH may represent an upper limit or a lower limit for a time period, and the count value CNT may represent a measured time period. In a case where the threshold value indicates the upper limit value, the comparator circuit 504 activates an alert signal ALT when the count value CNT is larger than the threshold value TH. In a case where the threshold value TH indicates the lower limit value, the comparator circuit 504 activates the alert signal ALT when the count value CNT is smaller than the threshold value TH. That is, an alert signal may be generated when a measured time period is an aberrant value.

Figure 6:
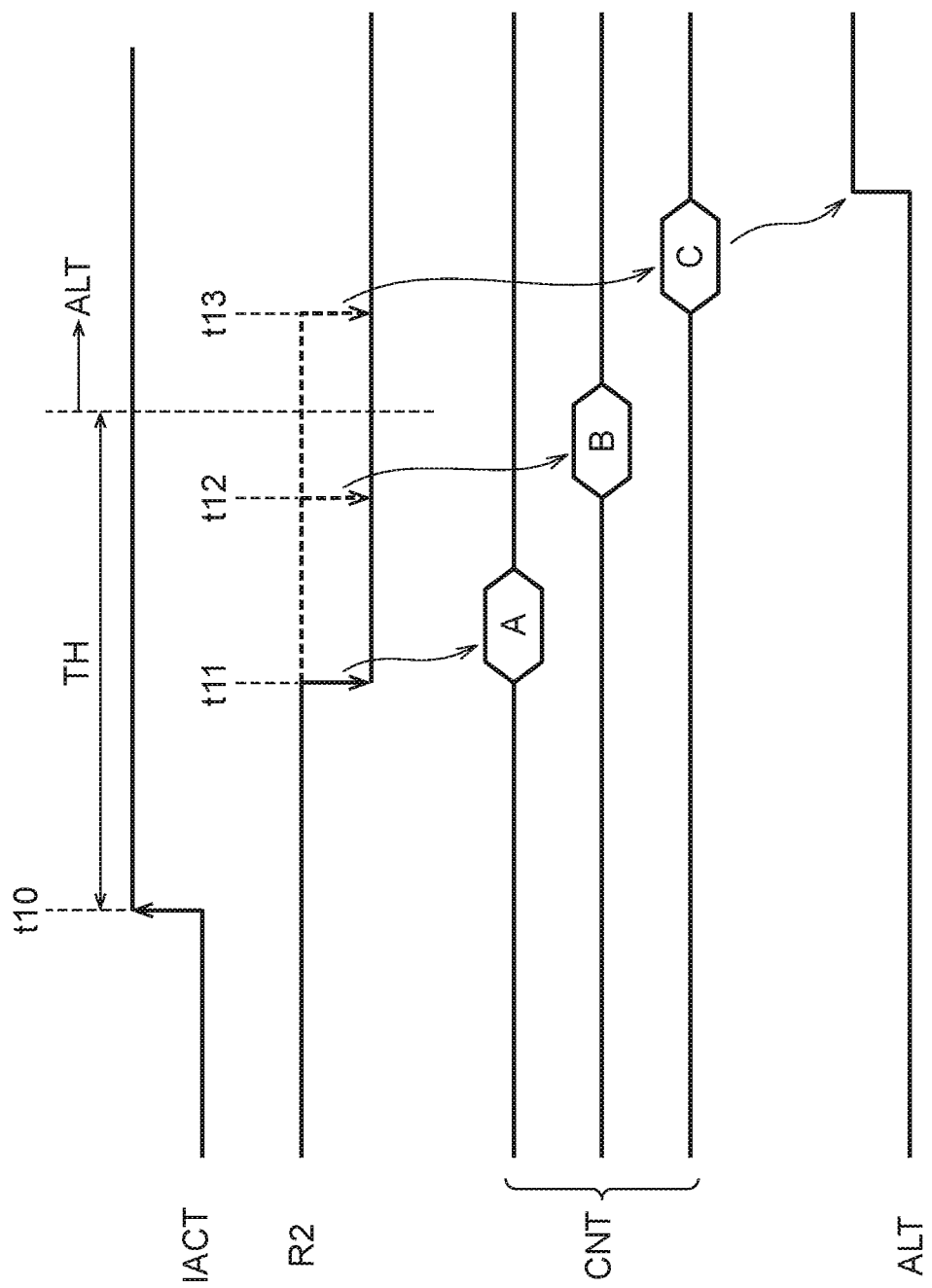
FIGS. 6 and 7 are timing charts of operations of the signal monitor circuit according to an embodiment of the disclosure.

The counter circuit 502 starts a counting operation that is synchronized with the oscillation signal USC in response to a start signal STR, and stops the counting operation in response to a stop signal SIP The start signal STR and the stop signal SIP are internal signals having a critical timing difference therebetween. For example, assuming that the active signal IACT is the start signal SIR and the timing signal R2 is the stop signal STP, it is possible to evaluate a time from activation of the active signal IACT to activation of the main word signal MWLB. In this case, when the active signal IACT is activated at a time t10 shown in FIG. 6, the counting operation of the counter circuit 502 is started. The counting operation of the counter circuit 502 is stopped when the timing signal R2 is activated. In an initial state after manufacturing, the timing of activation of the timing signal R2 is a time t11. In this case, the count value CNT of the counter circuit 502 is A and is sufficiently smaller than the threshold value TH. However, when the timing of activation of the timing signal R2 is delayed because of age deterioration of elements, the count value CNT of the counter circuit 502 increases. For example, in a case Where the timing of activation of the timing signal R2 is a time t12, the count value CNT increases to B (>A). In a case Where the timing of activation of the timing signal R2 is a time t13, the count value CNT increases to C (>B). In the example shown in FIG. 6, the threshold value TH is set to be the count value B or more and the count value C or less. Therefore, in a case where the timing signal R2 is activated at the time t13, the comparator circuit 504 activates the alert signal ALT. Accordingly, in a case where the time from activation of the active signal IACT to activation of the main word signal MWLB becomes longer to exceed a time corresponding to the threshold value TH, the alert signal ALT is generated.

Figure 7:
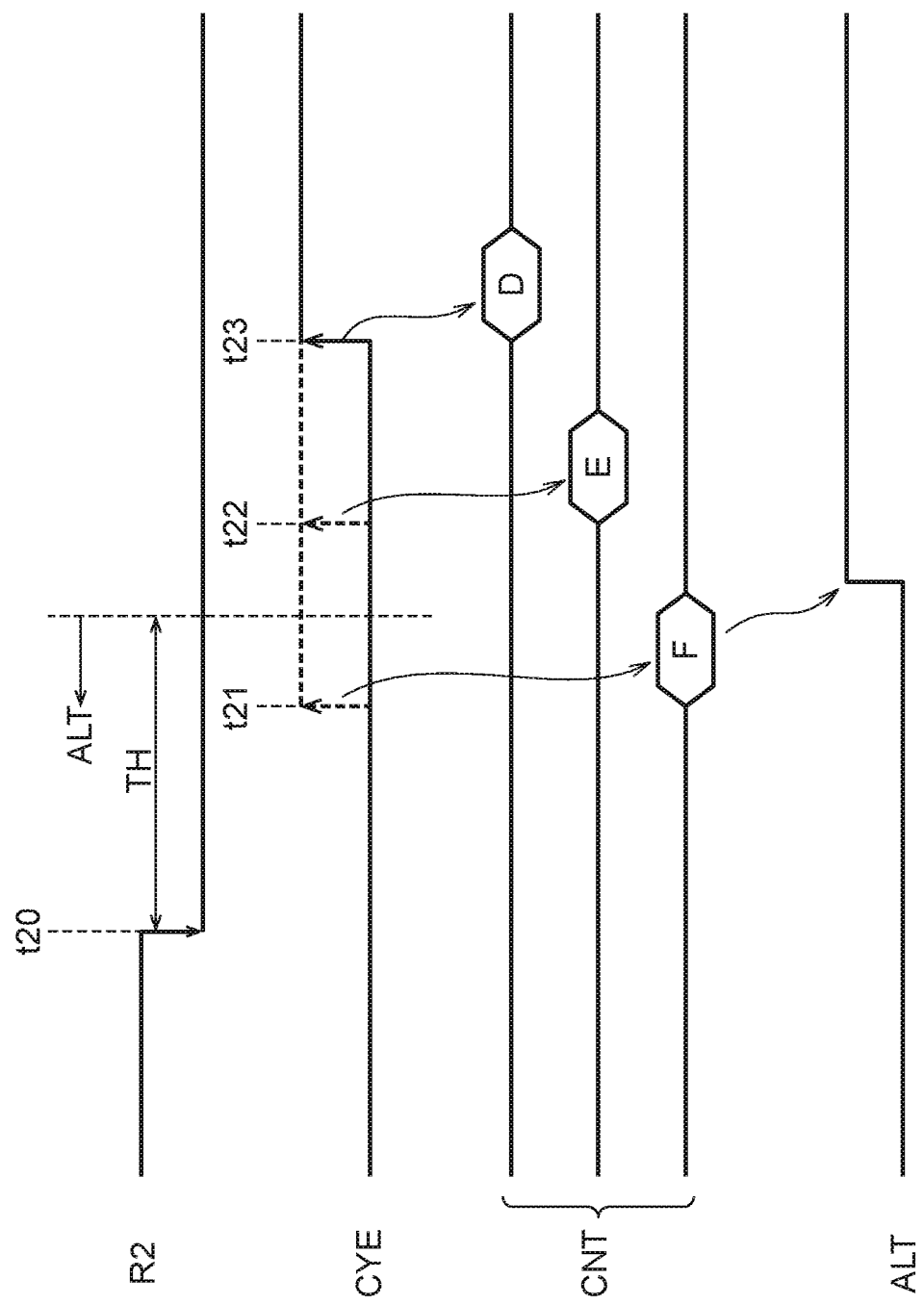

Alternatively, when the timing signal R2 is assumed as the start signal STR and the column enable signal CYE is assumed as the stop signal STP, it is possible to evaluate a time from activation of the main word signal MWLB to a power on of the column switch 262. In this case, when the timing signal R2 is activated at a time t20 shown in FIG. 7, a counting operation of the counter circuit 502 is started. The counting operation of the counter circuit 502 is stopped when the column enable signal CYE is activated. In an initial state after manufacturing, the timing of activation of the column enable signal CYE is a time t23. In this case, the count value CNT of the counter circuit 502 is D and is sufficiently larger than the threshold value TH. However, when the timing of activation of the column enable signal CYE is advanced (or the timing of activation of the timing signal R2 is delayed) because of age deterioration of elements, the count value CNT of the counter circuit 502 decreases. For example, in a case where the timing of activation of the column enable signal CYE is a time t22, the count value CNT decreases to E (<D). In a case where the timing of activation of the column enable signal CYE is a time t21, the count value CNT decreases to F (<E). In the example shown in FIG. 7, the threshold value TH is set to be the count value E or more and the count value F or less. Therefore, in a case where the column enable signal CYE is activated at the time t21, the comparator circuit 504 activates the alert signal ALT. Accordingly, in a case where the time from activation of the main word signal MWLB to a power on of the column switch 262 becomes shorter beyond a time corresponding to the threshold value TH, the alert signal AIX is generated.

The alert signal ALT is stored in the mode register 40. Therefore, the alert signal ALT can be read out to outside via the I/O circuit 30 by issuing a mode register read command from outside.

Figure 8:
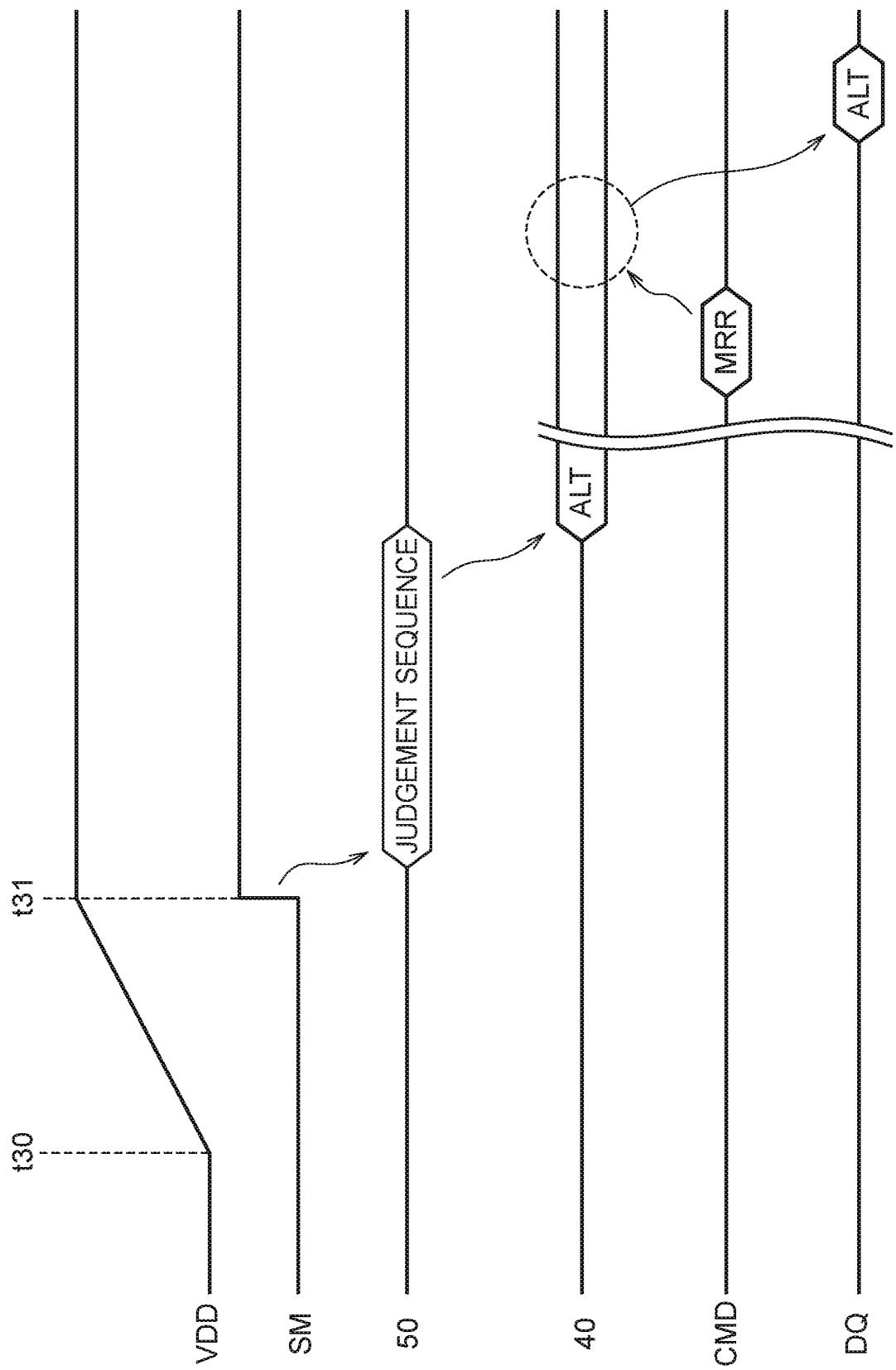
FIG. 8 is a timing chart showing an example of activating the signal monitor circuit in a period of an initializing operation according to an embodiment of the disclosure.

It is possible that evaluation using the signal monitor circuit 50 employs an internal signal generated in actual access. However, there is less necessity for frequently performing evaluation using the signal monitor circuit 50, because the signal monitor circuit 50 detects age deterioration caused by long-time use. Therefore, as shown in FIG. 8, it suffices that the signal monitor circuit 50 is activated at a timing when the power-on reset circuit 60 generates the monitoring start signal SM after power on. In the example shown in FIG. 8, the power is on at a time t30, and the power-on reset circuit 60 activates the monitoring start signal SM at a time t31. The signal monitor circuit 50 performs a judgement sequence shown in FIG. 6 or 7 in response to the monitoring start signal SM and stores the result in the mode register 40. In this case, the command decoder 23 internally generates the active signal IACT or the column enable signal CYE, which is a pseudo signal, in response to the monitoring start signal SM, thereby generating various internal signals generated in actual use, such as the timing signals R1 and R2, in a pseudo manner. Thereafter, when a mode register read command is issued from outside, the mode register read signal MRR is activated, and the alert signal ALT stored in the mode register 40 is output to outside via the I/O circuit 30.

Figure 9:
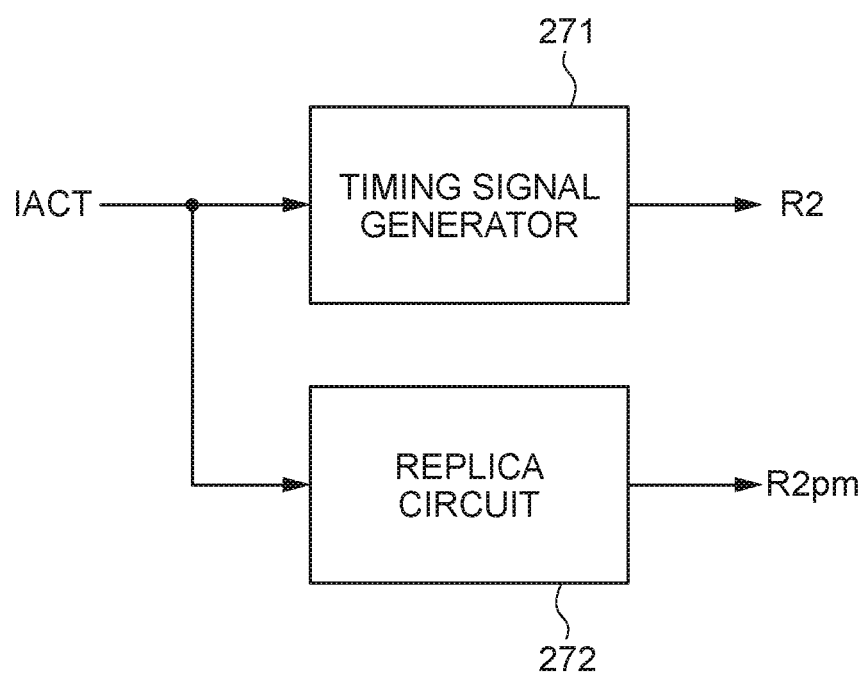
FIG. 9 is a block diagram showing an example in which a replica circuit is provided in a timing control circuit according to an embodiment of the disclosure.

The internal signal input to the signal monitor circuit 50 may be a signal used in actual access or a replica of the signal used in actual access. For example, as shown in FIG. 9, it is possible to configure that a timing signal generation circuit 271 that generates the timing signal R2 and a replica circuit 272 that generates a replica signal R2pm having the same waveform as the timing signal R2 are provided in the timing control circuit 27, and the timing signal R2 is used in actual access and the replica signal R2pm is used in evaluation using the signal monitor circuit 50. As the replica circuit 272, a process monitor circuit mounted in a semiconductor device in advance can be used. When the replica signal R2pm is input to the signal monitor circuit 50 in this manner, fallout of a transmission path for transmitting the timing signal R2 does not increase.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. An apparatus comprising:
  a first circuit configured to measure a first time period from a first active edge of one of plurality of internal signals to a second active edge of another one of the plurality of internal signals; and
  a second circuit configured to compare the first time period with a second time period to generate an alert signal.

2. The apparatus of claim 1, further comprising a third circuit configured to store an alert signal,
  wherein the alert signal is output to outside in response to a first command issued from outside.

3. The apparatus of claim 2,
  wherein the third circuit includes a mode register circuit, and
  wherein the first command is a mode register read command.

4. The apparatus of claim 1,
  wherein the first active edge is an edge of a first internal signal among the plurality of internal signals, and
  wherein the second active edge is an edge of a second internal signal different from the first internal signal among the plurality of internal signals.

5. The apparatus of claim 4, wherein the second circuit is configured to activate the alert signal when the first time period is longer than the second time period.

6. The apparatus of claim 5, wherein the first and second internal signals are generated in response to a second command issued from outside.

7. The apparatus of claim 6,
wherein the second command is an active command, and
wherein the first and second internal signals are ones of row-system signals sequentially generated based on the active command.

8. The apparatus of claim 4, wherein the second circuit is configured to activate the alert signal when the first time period is shorter than the second time period.

9. The apparatus of claim 8, wherein the first and second internal signals are generated in response to second and third commands, respectively, issued from outside.

10. The apparatus of claim 9,
wherein the second command is an active command,
wherein the third command is a read command or a write command,
wherein the first internal signal is one of row-system signals generated based on the active command, and
wherein the second internal signal is one of column-system signals generated based on the read command or the write command.

11. The apparatus of claim 1, wherein the first circuit is configured to start a counting operation in response to the first active edge and stop the counting operation in response to the second active edge to generate a first binary data indicating the first time period.

12. The apparatus of claim 11, wherein the second circuit is configured to compare the first binary data with a second binary data indicating the second time period.

13. The apparatus of claim 12, further comprising a fourth circuit configured to non-volatilely store the second binary data.

14. The apparatus of claim 1, wherein the first and second circuits are activated during an initial sequence performed at a power on.

15. An apparatus comprising:
a memory cell array including a plurality of memory cells;
an access control circuit configured to perform an access operation to the memory cell array using first and second signals sequentially activated;
a signal monitor circuit configured to evaluate a time period from when the first signal is activated to when the second signal is activated and generate an alert signal when the time period is an aberrant value;
a mode register circuit configured to store the alert signal; and
an I/O circuit coupled to the memory cell array and the mode register circuit,
wherein the access control circuit is configured to perform, in response to a data read command, a read operation to the memory cell array so that a-read data stored in one of the memory cells is output to outside through the I/O circuit and perform, in response to a mode register read command, a mode register read operation to the mode register circuit so that the alert signal is output to outside through the I/O circuit.

16. The apparatus of claim 15, wherein the signal monitor circuit is activated during an initial sequence performed at a power on.

* * * * *